US009847269B2

(12) United States Patent
Lin et al.

(10) Patent No.: US 9,847,269 B2
(45) Date of Patent: Dec. 19, 2017

(54) FAN-OUT PACKAGES AND METHODS OF FORMING SAME

(71) Applicant: Taiwan Semiconductor Manufacturing Company, Ltd., Hsin-Chu (TW)

(72) Inventors: Jing-Cheng Lin, Hsin-Chu (TW); Jeffrey Chang, Hsin-Chu (TW); Chun-Hsing Su, New Taipei (TW); Tsei-Chung Fu, Toufen Township (TW); Yi-Chao Mao, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/815,170

(22) Filed: Jul. 31, 2015

(65) Prior Publication Data

US 2017/0033063 A1 Feb. 2, 2017

(51) Int. Cl.
*H01L 23/48* (2006.01)
*H01L 23/52* (2006.01)
*H01L 29/40* (2006.01)
*H01L 23/31* (2006.01)
*H01L 21/56* (2006.01)
*H01L 23/00* (2006.01)

(52) U.S. Cl.
CPC ........ *H01L 23/3114* (2013.01); *H01L 21/565* (2013.01); *H01L 24/19* (2013.01); *H01L 24/20* (2013.01); *H01L 2224/04105* (2013.01); *H01L 2224/12105* (2013.01); *H01L 2224/94* (2013.01); *H01L 2924/18162* (2013.01)

(58) Field of Classification Search
CPC ......... H01L 2924/00; H01L 2224/3225; H01L 2224/16225; H01L 2924/181; H01L 24/02; H01L 21/565; H01L 23/3135; H01L 2224/02315; H01L 2224/02331; H01L 2224/02379; H01L 2924/15; H01L 23/28; H01L 24/03
USPC ............... 257/787, 773, 788, 789, 790, 795; 438/107, 127, 124, 126
See application file for complete search history.

(56) References Cited

U.S. PATENT DOCUMENTS

| 6,255,738 | B1* | 7/2001 | Distefano ............... H01L 23/24 257/787 |
|---|---|---|---|
| 8,361,842 | B2 | 1/2013 | Yu et al. |
| 8,610,292 | B2 | 12/2013 | Chino |

(Continued)

FOREIGN PATENT DOCUMENTS

WO 2014051233 A2 4/2014

*Primary Examiner* — Lex Malsawma
*Assistant Examiner* — Nduka Ojeh
(74) *Attorney, Agent, or Firm* — Slater Matsil, LLP

(57) ABSTRACT

An embodiment a device package includes a semiconductor die, a molding compound extending along sidewalls of the semiconductor die, and a planarizing polymer layer over the molding compound and extending along the sidewalls of the semiconductor die. The molding compound includes first fillers, and the planarizing polymer layer includes second fillers smaller than the first fillers. The device package further includes one or more fan-out redistribution layers (RDLs) electrically connected to the semiconductor die, wherein the one or more fan-out RDLs extend past edges of the semiconductor die onto a top surface of the planarizing polymer layer.

20 Claims, 8 Drawing Sheets

(56) References Cited

U.S. PATENT DOCUMENTS

| | | |
|---|---|---|
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2005/0029642 A1* | 2/2005 | Takaya ............... H01L 23/5389 257/678 |
| 2009/0302448 A1* | 12/2009 | Huang ................. H01L 21/565 257/686 |
| 2011/0291288 A1 | 12/2011 | Wu et al. |
| 2012/0187568 A1* | 7/2012 | Lin .................. H01L 21/76898 257/774 |
| 2013/0001776 A1* | 1/2013 | Yu ....................... H01L 21/565 257/738 |
| 2013/0009319 A1* | 1/2013 | Shao ..................... B29C 43/18 257/774 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0082378 A1* | 4/2013 | Chino .................. H01L 21/561 257/734 |
| 2013/0168848 A1 | 7/2013 | Lin et al. |
| 2013/0307140 A1* | 11/2013 | Huang ............. H01L 23/49827 257/737 |
| 2013/0307143 A1 | 11/2013 | Lin et al. |
| 2014/0203429 A1 | 7/2014 | Yu et al. |
| 2014/0217604 A1 | 8/2014 | Chou et al. |
| 2014/0225222 A1 | 8/2014 | Yu et al. |
| 2014/0252646 A1 | 9/2014 | Hung et al. |
| 2014/0264813 A1* | 9/2014 | Lin ....................... H01L 21/563 257/690 |
| 2014/0264930 A1 | 9/2014 | Yu et al. |
| 2015/0187743 A1 | 7/2015 | Yu et al. |
| 2015/0318228 A1* | 11/2015 | Ito ........................ H01L 21/563 257/789 |

* cited by examiner

FAN-OUT PACKAGES AND METHODS OF FORMING SAME

BACKGROUND

In an aspect of conventional packaging technologies, such as wafer level packaging (WLP), redistribution layers (RDLs) may be formed over a die and electrically connected to active devices in a die. External input/output (I/O) pads such as solder balls on under-bump metallurgy (UBMs) may then be formed to electrically connect to the die through the RDLs. An advantageous feature of this packaging technology is the possibility of forming fan-out packages. Thus, the I/O pads on a die can be redistributed to a greater area than the die, and hence the number of I/O pads packed on the surfaces of the dies can be increased.

In such packaging technologies, a molding compound may be formed around the die to provide surface area to support the fan-out interconnect structures. For example, RDLs typically include one or more polymer layers formed over the die and molding compound. Conductive features (e.g., conductive lines and/or vias) are formed in the polymer layers and electrically connect I/O pads on the die to the external I/O pads over the RDLs. The external I/O pads may be disposed over both the die and the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
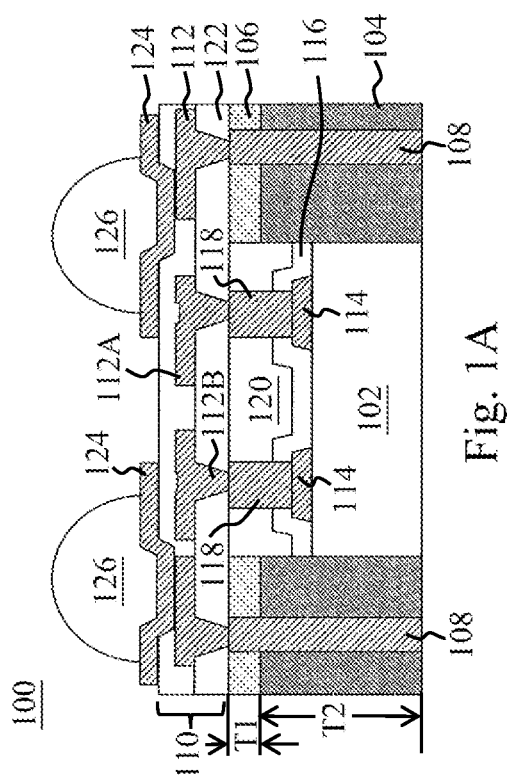
FIGS. 1A and 1B illustrate cross-sectional views of a semiconductor package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include a fan-out package structure having a semiconductor die and fan-out redistribution layers (RDLs) formed over the die. A molding compound and a planarizing polymer layer are formed around the semiconductor die to provide surfaces for supporting the fan-out RDLs. The planarizing polymer layer may be formed between the molding compound and the RDLs. In various embodiments, both the planarizing polymer layer and the molding compound include various filler materials. Such fillers may be advantageously included to improve adhesion, release stress, reduce coefficient of thermal expansion (CTE) mismatch, and the like. The planarizing polymer layer includes fillers having a smaller average diameter than the fillers of the molding compound. For example, an average diameter of the smaller filler may be no more than fifty percent of an average diameter of the larger filler. In another embodiment, the planarizing polymer layer may be substantially free of fillers. When a planarization process (e.g., grinding) is applied to the polymer, the smaller filler size (or lack of filler) results in an improved top surface (e.g., more level) for forming fan-out RDLs. However, materials having larger fillers (e.g., the molding compound) may be less expensive than materials having smaller fillers (e.g., the planarizing polymer layer). By including both the molding compound and the polymer in the package, improved planarization can be achieved without significantly increasing manufacturing costs.

FIG. 1A illustrates a cross-sectional view of a fan-out device package 100 in accordance with various embodiments. Package 100 includes a semiconductor die 102; a molding compound 104 and a planarizing polymer layer 106 disposed around die 102; and RDLs 110 (e.g., having conductive features 112) formed over die 102 and molding compound 104/planarizing polymer layer 106. Conductive through-intervias (TIVs) 108 are formed extending through molding compound 104/planarizing polymer layer 106. Die 102 may be a semiconductor die and could be any type of integrated circuit, such as a processor, logic circuitry, memory, analog circuit, digital circuit, mixed signal, and the like.

Die 102 may include a substrate, active devices, and an interconnect structure (not individually illustrated). The substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices such as transistors, capacitors, resistors, diodes, photo-diodes, fuses, and the like may be formed at the top surface of the substrate. An interconnect structure may be formed over the active devices and the substrate. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, chemical vapor deposition (CVD), and plasma-enhanced CVD (PECVD). The interconnect structure electrically connect various active devices to form functional circuits within die 102. The functions provided by such circuits may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Input/output (I/O) and passivation features may be formed over the interconnect structure. For example, contact pads 114 may be formed over the interconnect structure and may be electrically connected to the active devices through the various conductive features in the interconnect structure. Contact pads 114 may comprise a conductive material such as aluminum, copper, and the like. Furthermore, a passivation layer 116 may be formed over the interconnect structure and the contact pads. In some embodiments, passivation layer 116 may be formed of non-organic materials such as silicon oxide, un-doped silicate glass, silicon oxynitride, and the like. Other suitable passivation materials may also be used. Portions of passivation layer 116 may cover edge portions of the contact pads 114.

Additional interconnect features, such as additional passivation layers, conductive pillars, and/or under bump metallurgy (UBM) layers, may also be optionally formed over contact pad 114. For example, as illustrated by FIG. 1A, conductive pillars 118 may be formed on and electrically connect to contact pads 114, and a dielectric layer 120 may be formed around such conductive pillars 118. The various features of dies 102 may be formed by any suitable method and are not described in further detail herein. Furthermore, the general features and configuration of dies 102 described above are but one example embodiment, and dies 102 may include any combination of any number of the above features as well as other features.

Molding compound 104 is disposed around die 102. For example, in a top down view of molding compound 104/die 102 (not illustrated), molding compound 104 may encircle die 102. Molding compound 104 may provide support for forming fan-out RDLs, such as RDLs 110. Molding compound 104 may include any suitable material such as an epoxy resin, phenol resin, a thermally-set resin, and the like. In addition to these materials, molding compound 104 may further include various additive fillers 104' (see FIG. 1B). Fillers 104' may be included to advantageously improve adhesion, release stress, reduce CTE mismatch, and the like. Fillers 104' may comprise silicon oxide, aluminum oxide, boron nitride, and the like, for example. Other filler materials, which may be included for other purposes may also be used.

A planarizing polymer layer 106 is also disposed around die 102 over molding compound 104. For example, in a top down view of polymer layer 106/die 102 (not illustrated), polymer layer 106 may also encircle die 102. Polymer layer 106 may provide a substantially level top surface for supporting fan-out RDLs, such as RDLs 110. Polymer layer 106 may comprise a suitable resin material such as epoxy resin, phenol resign, a thermally-set resin, and the like. In addition to these materials, polymer layer 106 may also include various additive fillers 106' (see FIG. 1B). Fillers 106' may be included to advantageously improve adhesion, release stress, reduce coefficient of thermal expansion (CTE) mismatch, and the like, and fillers 106' may comprise silicon oxide, aluminum oxide, boron nitride, and the like, for example. Other filler materials, which may be included for other purposes may also be used. In another embodiment, polymer layer 106 may be substantially free of any fillers. Conductive TIVs 108 extends through molding compound 104 and polymer layer 106, and a planarization process may be applied so that top surfaces of polymer layer 105, die 102, and TIVs 108 are substantially level.

Figure 1B:
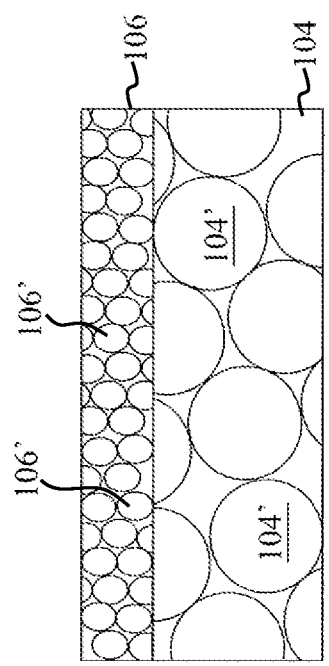

As illustrated by FIG. 1B, fillers 106' in polymer layer 106 are smaller than filler 104' in molding compound 104. In some embodiments, an average diameter of fillers 106' may no more than about fifty percent of an average diameter of fillers 104'. For example, fillers 104' may have an average diameter of about 25 µm or less while fillers 106' have an average diameter of about 5 µm or less. Fillers having other dimensions may also be used. It has been observed that when planarization processes (e.g., mechanical grinding) is applied to materials having smaller fillers, the resulting planarized surface is more planar than when such processes are applied to materials having larger fillers. This is because when a planarization process is applied to a surface of materials having fillers, a portion of the fillers are removed. Thus, when larger fillers are removed, the resulting gaps in the material are larger (e.g., less planar) than gaps left when smaller fillers are removed.

However, materials having smaller fillers may also be more costly. Thus, by combining a relatively low-cost molding compound 104 having larger fillers with a planarizing polymer layer 106 having smaller fillers (e.g., in the dimensions described above), improved planarization can be achieved without significantly increasing manufacturing costs. In order to reduce cost, an average thickness T2 of molding compound 104 may be greater than an average thickness T2 of polymer layer 106. For example, in an embodiment, an average thickness T1 of polymer layer 106 may no more than about twenty percent of an average thickness T2 of molding compound 104 to reduce manufacturing costs. Other embodiments may include molding compounds/polymer layers having other relative dimensions.

One or more RDLs 110 may be formed over die 102 and polymer layer 106. RDLs 110 may extend laterally past edges of die 102 onto a top surface of polymer layer 106 to provide fan-out interconnect structures. RDLs 110 may include one or more polymer layers 122 formed over top surfaces of die 102 and polymer layer 106. In an embodiment, RDLs 110 may contact a top surface of polymer layer 106. In some embodiments, polymer layers 122 may comprise polyimide (PI), polybenzobisoxazole (PBO), benzocyclobuten (BCB), epoxy, silicone, acrylates, nano-filled pheno resin, siloxane, a fluorinated polymer, polynorbornene, and the like formed using any suitable means such as spin-on techniques, and the like.

Conductive features 112 (e.g., conductive lines 112A and conductive vias 112B) are formed within polymer layers 122. Conductive lines 112A may be formed over a polymer layer 122, and conductive vias 120B may extend through the polymer layer 122 and electrically connect to die 102 and TIVs 108. Although two polymer layers 122 are explicitly illustrated, RDLs 110 may further include any number of polymer layers having conductive features disposed therein depending on package design.

Additional package features, such as UBMs 124 and external connectors 126 are formed over RDLs 110. Connectors 126 may be solder balls, such as, ball grid array (BGA) balls, controlled collapse chip connector (C4) bumps, microbumps, and the like. Connectors 126 may be electrically connected to die 102 and TIVs 108 by way of conductive features 112 in RDLs 110. Connectors 126 may be used to electrically connect package 100 to other package components such as another device die, interposers, package substrates, printed circuit boards, a mother board, and the like.

Figure 2:
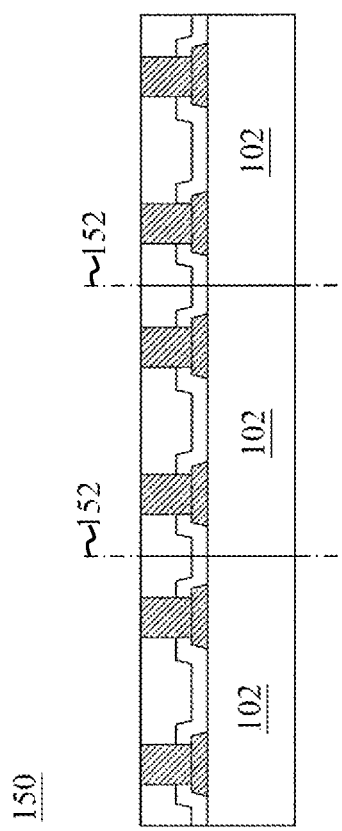
FIGS. 2 through 9 illustrate cross-sectional views of various intermediary stages of manufacturing a semiconductor package in accordance with some embodiments.
Figure 3:
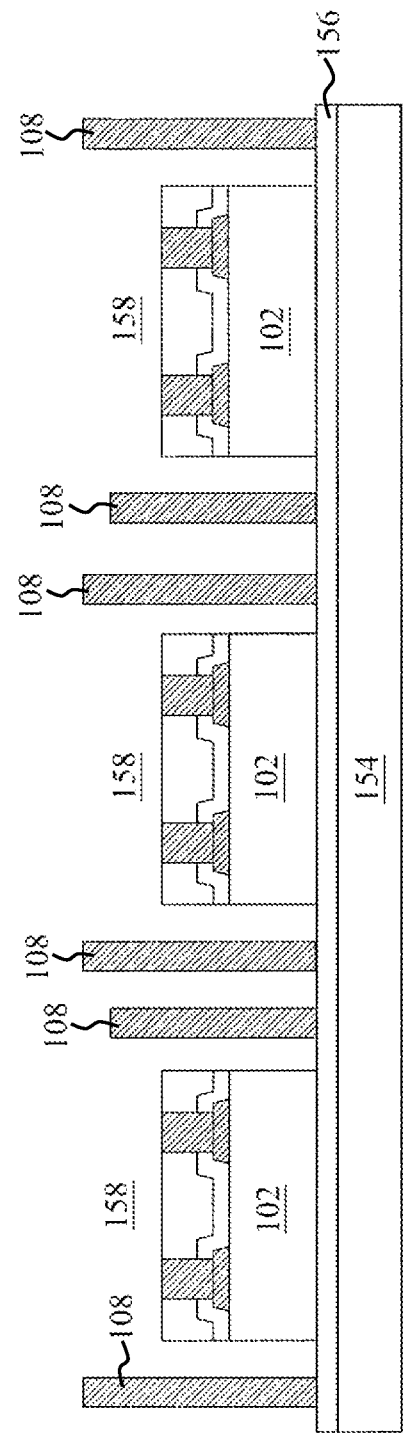

FIGS. 2 through 9 illustrate various intermediary steps of forming package 100 according to some embodiments. Although described as dies 102 throughout, one of ordinary skill will readily understand that some processing on dies 102 may occur while dies 102 is part of a larger substrate, for example, wafer 150 as illustrated by FIG. 2. After formation, dies 102 may be singulated from other structures (e.g., other dies) in wafer 150 along scribe lines 152. Next, in FIG. 3, dies 102 are attached to a carrier 154 (e.g., using a die attach film (DAF) 156) for further processing. Carrier 154 may be a glass or ceramic carrier and may provide temporary structural support during the formation of various features of package 100.

Furthermore, TIVs 108 may be formed over carrier 154 prior to the attachment of dies 102. TIVs 108 may comprise copper, nickel, silver, gold, and the like for example, and may be formed by any suitable process. For example, a seed layer (not shown) may be formed over carrier 154, and a patterned photoresist (not shown) having openings may be used to define the shape of TIVs 108. The openings may expose the seed layer, and the openings may be filled with a conductive material (e.g., in an electro-chemical plating process, electroless plating process, and the like). Subsequently, the photoresist may be removed in an ashing and/or wet strip process, leaving TIVs 108 over carrier 154. TIVs 108 can also be formed using copper wire stud by copper wire bond processes (e.g., where mask, photoresist, and copper plating are not required). Top surfaces of TIVs 108 may or may not be substantially level, and TIVs 108 are formed to have a vertical dimension greater than a dimension of dies 102. For example, after dies 102 are attached to carrier 154, TIVs 108 extend higher than a top surface of dies 102. Openings 158 may be disposed between adjacent groups of TIVs 108, and openings 158 may have sufficiently large dimensions to dispose a die 102 therein. After TIVs 108 are formed, dies 102 are placed within openings 158 on DAF 156.

Figure 4A:
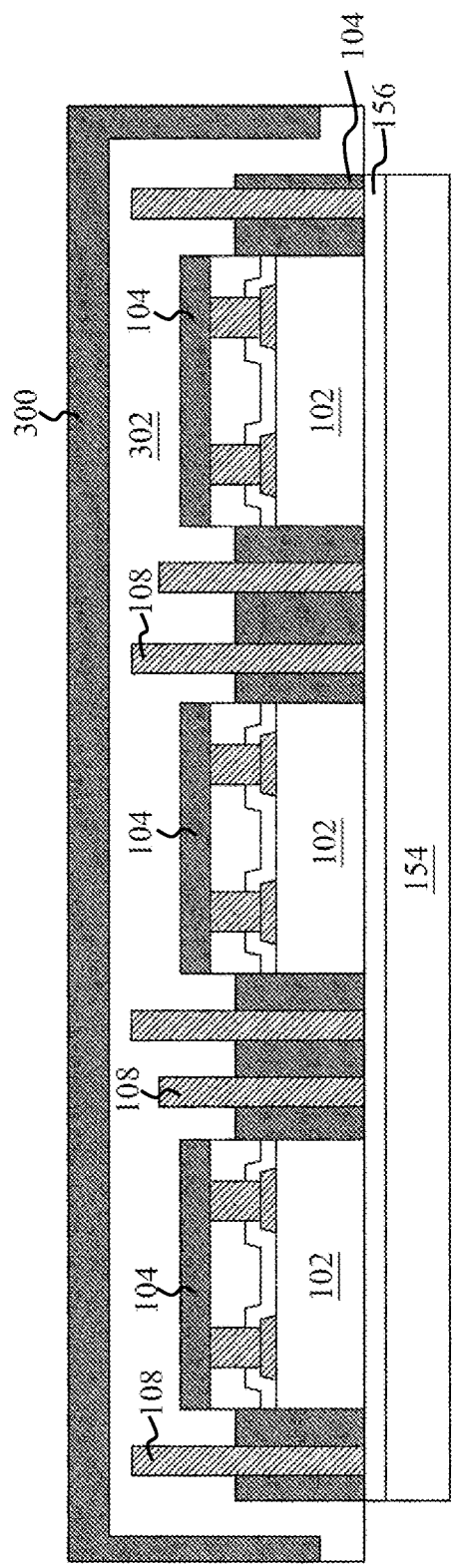
Figure 4B:
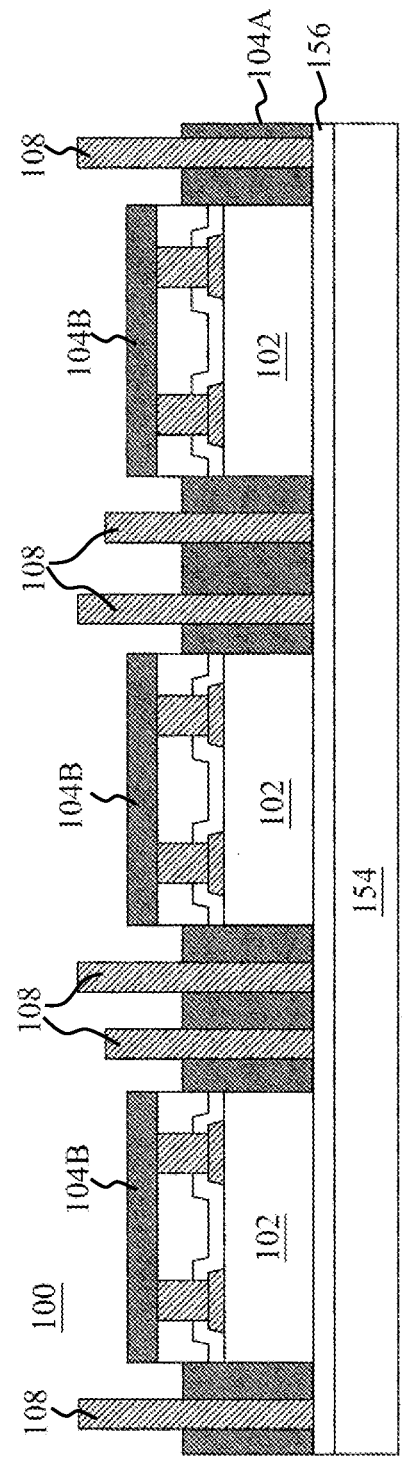

In FIGS. 4A and 4B, molding compound 104 is formed around dies 102 and TIVs 108. Suitable methods for forming molding compound 104 may include compressive molding, transfer molding, liquid encapsulent molding, and the like. For example, molding compound 104 is shaped or molded using a molding tool 300 which may have a border or other feature for retaining molding compound 104 when applied. During application, dies 102 and TIVs 108 may be embedded in a release film 302, which may comprise polyethylene terephthalate (PET), teflon, and the like. Molding tool 300 may be used to pressure mold molding compound 104 around dies 102 to force molding compound 104 into openings and recesses, eliminating air pockets or the like. Molding compound 104 may be dispensed around dies 102/TIVs 108 in liquid form. Subsequently, a curing process is performed to solidify molding compound 104. After molding compound 104 is formed, molding tool 300 and release film 302 may be removed. Release film 302 may be used to facilitate the removal of molding tool 300.

During the filling of molding compound 104, the volume of molding compound 104 may be controlled so that dies 102 and TIVs 108 extend above a first portion 104A of molding compound 104. Portion 104A may be disposed around dies 102 and TIVs 108, and a top surface of portion 104A is lower than top surfaces of dies 102 and TIVs 108. Furthermore, as a result of the molding process, a second portion 104B of molding compound 104 may also be formed on a top surface of dies 102. Some portion of molding compound 104 (not illustrated) may also be formed on TIVs 108. However, due to the relatively small size of TIVs 108, TIVs 108 may be further embedded within release film 302 during the molding. As a result, less molding compound 104 is formed on a top surface of TIVs 108 than dies 102. In an embodiment, the amount of molding compound 104 formed on TIVs 108 may be none (or nearly none). In various embodiments, molding compound 104 comprises fillers (e.g., fillers 104' in FIG. 1B), which may have an average diameter of about 25 µm or less, for example.

Figure 5:
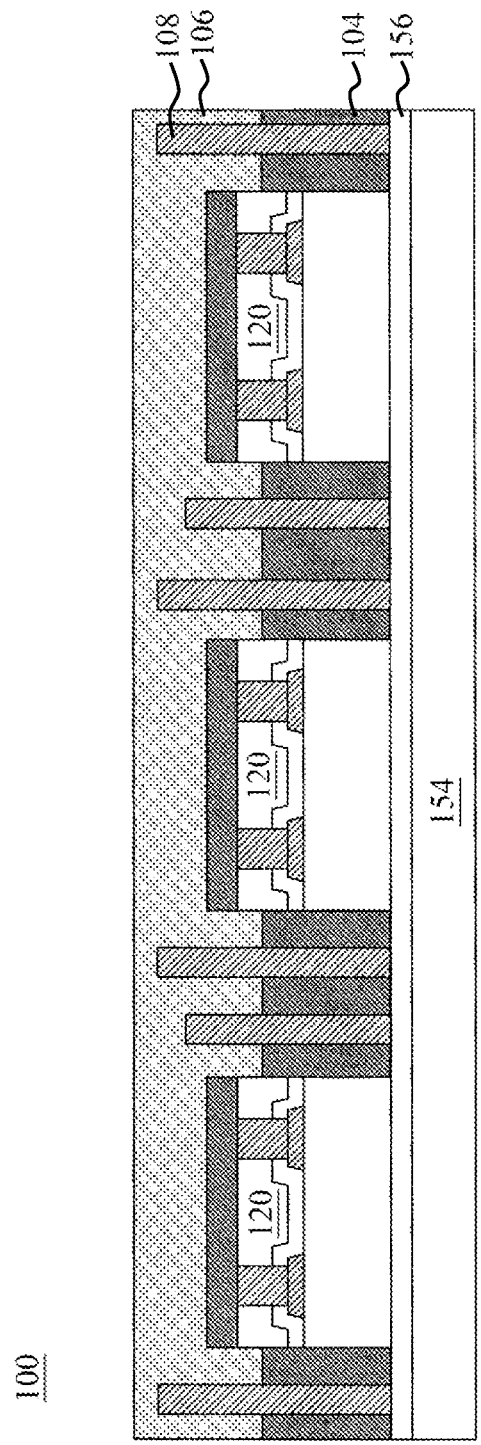

Referring next to FIG. 5, planarizing polymer layer 106 may be formed over top surfaces of molding compound 104, dies 102, and TIVs 108. Polymer layer 106 may further extend at least partially along sidewalls of dies 102 and sidewalls of TIVs 108. An interface between polymer layer 106 and molding compound 104 may intersect dies 102 (e.g., dielectric layers 120) and TIVs 108. In various embodiments, planarizing polymer layer 106 includes a resin material having fillers (e.g., fillers 106' in FIG. 1B), which may have an average diameter smaller than the fillers in molding compound 104. For example, the fillers in polymer layer 106 may have an average diameter that is no more than fifty percent of an average diameter of the fillers in molding compound 104. In an embodiment, fillers in polymer layer 106 have an average diameter of about 5 µm or less. In another embodiment, polymer layer 106 may be substantially free of fillers. Suitable methods for forming polymer layer 106 may include lamination, a spin-on coating process, and the like.

Figure 6:
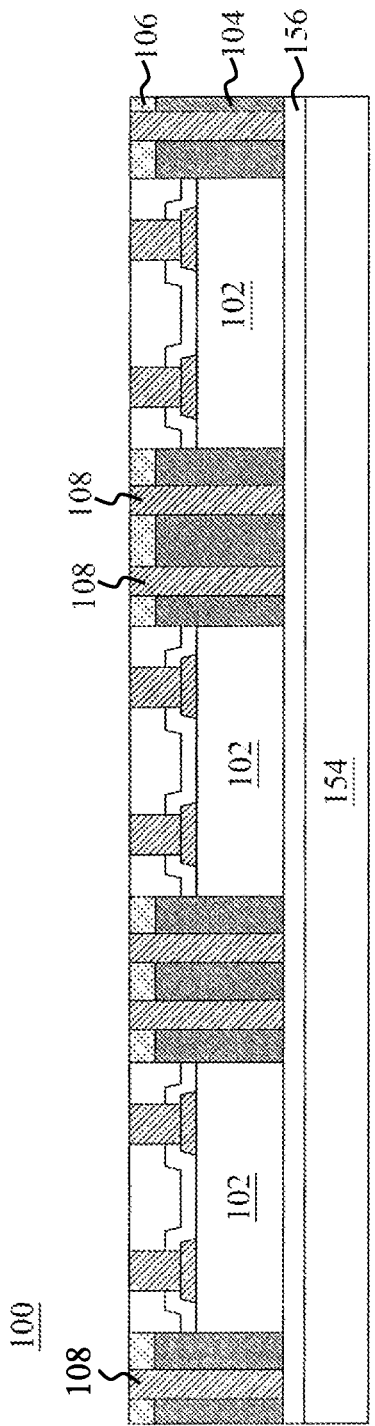

Next, in FIG. 6, a planarization process (e.g., a mechanical grinding, chemical mechanical polish (CMP), or other etch back technique) may be employed to remove excess portions of polymer layer 106 over dies 102. The planarization process may further remove excess portions of molding compound 104 (e.g., portion 104B, see FIG. 4) and upper portions of TIVs 108. After planarization, TIVs 108 and connectors (e.g., conductive pillars 118) of die 102 are exposed, and top surfaces of polymer layer 106, TIVs 108, and die 102 may be substantially level. Because TIVs 108 and die 102 may be exposed by the planarization process, a separate patterning of polymer layer 106 to expose such features may be omitted, which reduces manufacturing costs. Furthermore, due to the relatively small filler size of polymer layer 106, a top surface of polymer layer 106 may have improved planarity compared to packages where the planarization is applied directly to molding compound 104 without polymer layer 106.

Figure 7:
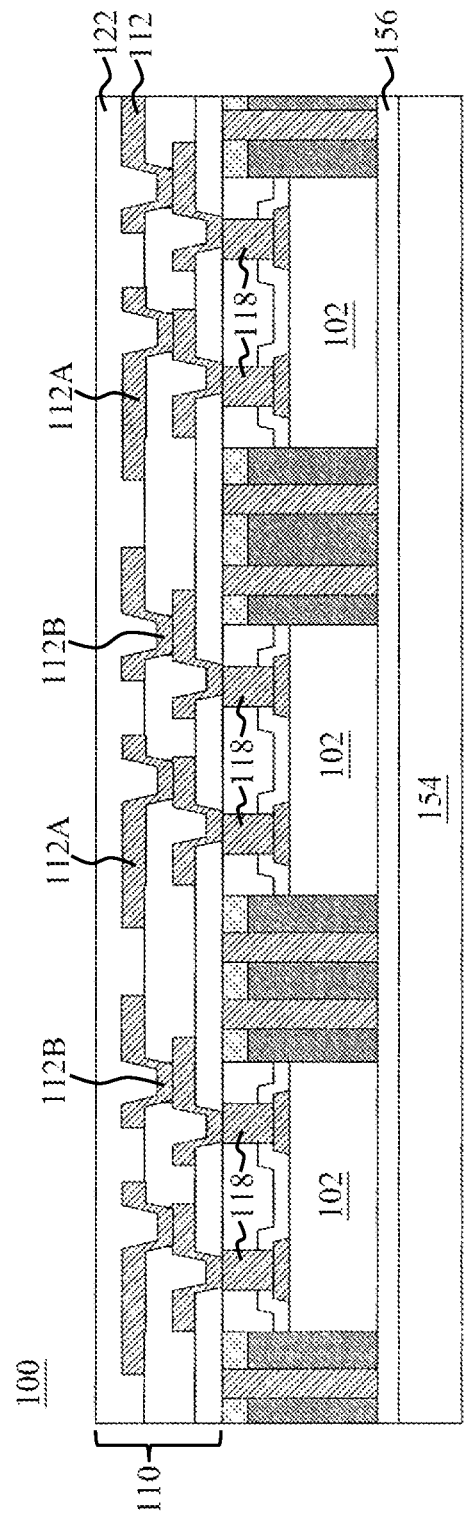

FIG. 7 illustrates the formation of RDLs 110 over polymer layer 106, dies 102, and TIVs 108. RDLs 110 may extend laterally past edges of dies 102 over a top surface of polymer layer 106. Because of the relatively planar top surface provided by polymer layer 106, RDLs 110 may be formed with fewer defects (e.g., delamination, conductive line breakage, and the like). RDLs 110 may include conductive features 112 formed in one or more polymer layers 122. Polymer layers 122 may be formed of any suitable material (e.g., polyimide (PI), polybenzoxazole (PBO), benzocyclobuten (BCB), epoxy, silicone, acrylates, nano-filled pheno resin, siloxane, a fluorinated polymer, polynorbornene, and the like) using any suitable method, such as, a spin-on coating technique, lamination, and the like.

Conductive features 112 (e.g., conductive lines 112A and/or vias 112B) may be formed in polymer layers 122 and electrically connect to TIVs 108 as well as conductive pillars 118 of dies 102. The formation of conductive features 112 may include patterning polymer layers 122 (e.g., using a combination of photolithography and etching processes) and forming conductive features over and in the patterned polymer layer. The formation of conductive features 112 may include depositing a seed layer (not shown), using a mask layer (not shown) having various openings to define the shape of conductive features 112, and filling the openings in the mask layer using an electro-chemical plating process, for example. The mask layer and excess portions of the seed layer may then be removed. Thus, RDLs 110 are formed over dies 102, TIVs 108, and polymer layer 106. The number of polymer layers and conductive features of RDLs 110 is not limited to the illustrated embodiment of FIG. 7. For example, RDLs 110 may include any number of stacked, electrically connected conductive features in multiple polymer layers.

Figure 8:
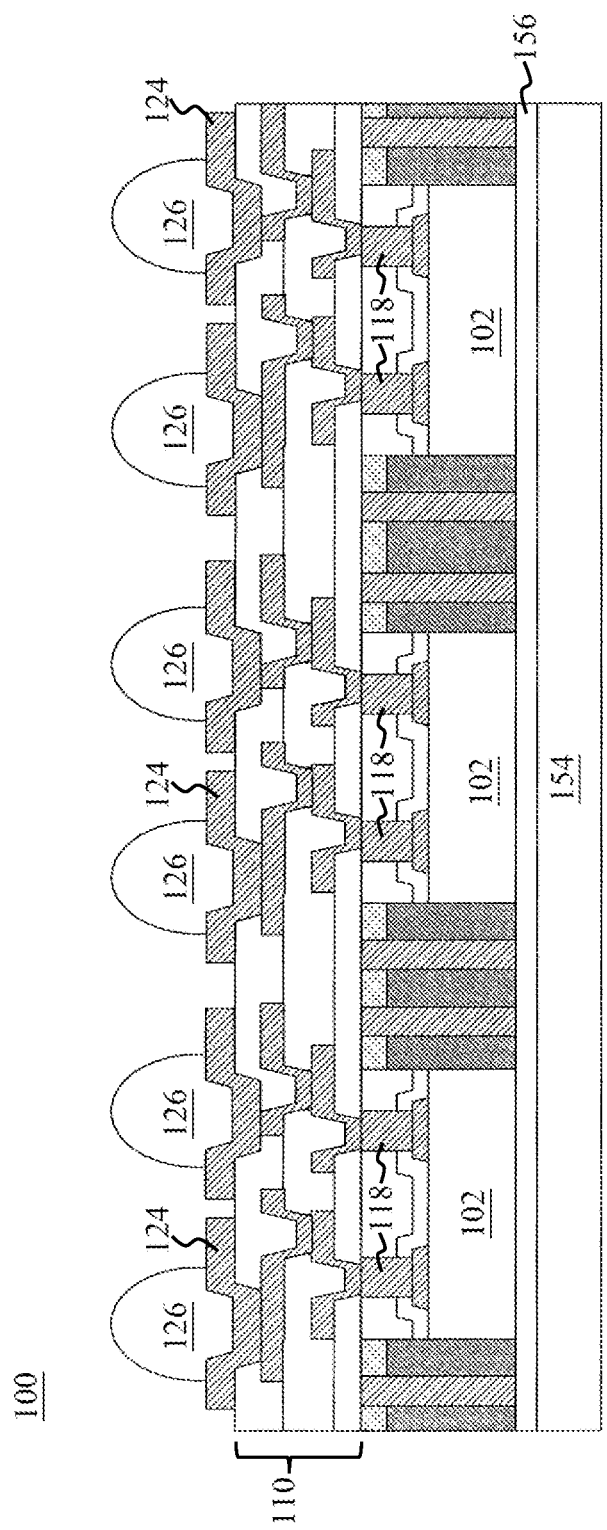
Figure 9:
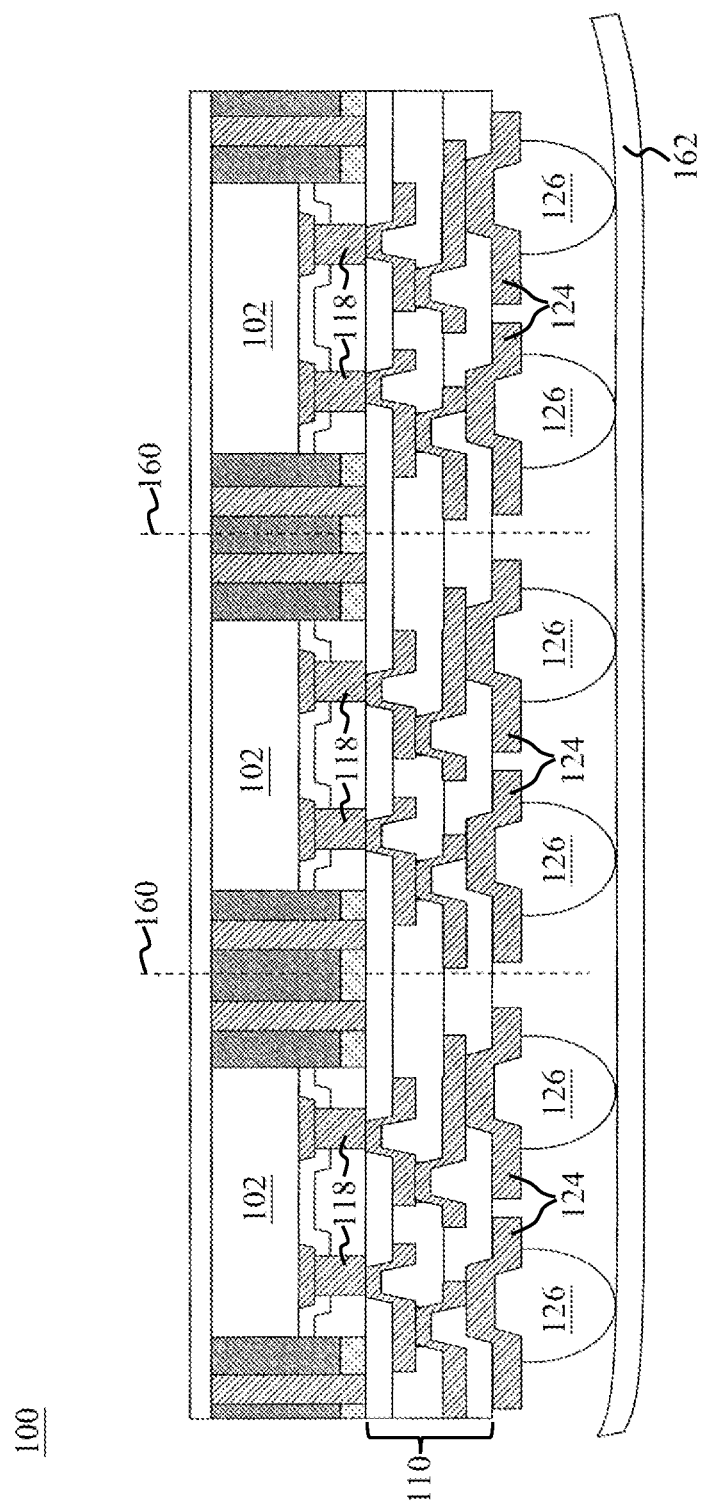

In FIG. 8, additional package features, such as external connectors 126 (e.g., BGA balls, C4 bumps, and the like) may be formed over RDLs 110. Connectors 126 may be disposed on UBMs 124, which may also be formed over RDLs 110. Connectors 126 may be electrically connected to dies 102 and TIVs 108 by way of RDLs 110. Connectors 126 may be used to electrically connect package 100 to other package components such as another device die, interposers, package substrates, printed circuit boards, a mother board, and the like. Subsequently, in FIG. 9, carrier 154 may be removed and each package 100 (including die 102, corresponding portions of RDLs 110, UBMs 124, and connectors 126) may be singulated along scribe lines 160 using a suitable die saw technique. During singulation, a support film 162 may be temporary applied to connectors 126 to structurally support package 100. After singulation, support film 162 may be removed.

Figure 10:
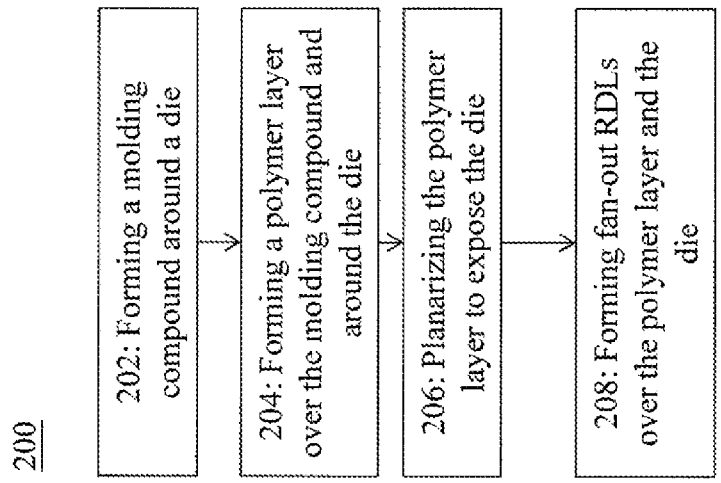
FIG. 10 illustrates a process flow for manufacturing a semiconductor package in accordance with some embodiments.

FIG. 10 illustrates a process flow 200 for forming a device package (e.g., package 100) according to various embodiments. In step 202, a molding compound (e.g., molding compound 104) is formed around a semiconductor die (e.g., die 102) and TIVs (e.g., TIV 108). During formation, a volume of the molding compound dispensed may be controlled so that a first portion (e.g., portion 104A) of the molding compound is lower than a top surface of the die. Forming the molding compound may further include forming a second portion (e.g., portion 104B) on a top surface of the die. In step 204, a polymer layer (e.g., polymer layer 106) is formed over the molding compound around the die and the TIVs. The polymer layer may comprise a resin material having fillers disposed therein. An average diameter of the fillers (e.g., fillers 106') in the polymer layer may be smaller than an average diameter of fillers (e.g., fillers 104') in the molding compound.

In step 206, a planarization process (e.g., mechanical grinding) is applied to the polymer layer to expose the die. The planarization process may further remove upper portions of the TIVs and the second portion of the molding compound. After planarization, top surfaces of the polymer layer, the die, and the TIVs may be substantially level. In step 208, fan-out RDLs are formed over the die and the polymer layer. In an embodiment, the fan-out RDLs may contact a top surface of the polymer layer, which provides a substantially level surface for supporting the fan-out RDLs. The fan-out RDLs are electrically connected to the die and the TIVs.

Various embodiments include a fan-out package structure having a semiconductor die and fan-out RDLs formed over the die. A molding compound and a planarizing polymer layer are formed around the semiconductor die to provide surfaces for supporting the fan-out RDLs. TIVs are formed extending through the molding compound and the planarizing polymer layer. In various embodiments, both the planarizing polymer layer and the molding compound include various filler materials. Such fillers may be advantageously included to improve adhesion, release stress, reduce coefficient of thermal expansion (CTE) mismatch, and the like. The planarizing polymer layer includes fillers having a smaller average diameter than the fillers of the molding compound. When a planarization process (e.g., grinding) is applied to the polymer, the smaller filler size results in a more level top surface for forming the fan-out RDLs. Furthermore, materials having larger fillers (e.g., the molding compound) may be less expensive than materials having smaller fillers (e.g., the planarizing polymer layer). By including both the molding compound and the polymer in the package, improved planarization can be achieved without significantly increasing manufacturing costs.

In accordance with an embodiment, a device package includes a semiconductor die, a molding compound disposed around the semiconductor die, a planarizing polymer layer over the molding compound and around the semiconductor die, and a through-intervia (TIV) extending through the molding compound and the planarizing polymer layer. A fan-out redistribution layer (RDL) is disposed over the semiconductor die and the planarizing polymer layer. The fan-out RDL is electrically connected to the semiconductor die and the TIV.

In accordance with another embodiment, a device package includes a semiconductor die, a molding compound extending along sidewalls of the semiconductor die, and a planarizing polymer layer over the molding compound and extending along the sidewalls of the semiconductor die. The molding compound includes first fillers, and the planarizing polymer layer includes second fillers smaller than the first fillers. The device package further includes one or more fan-out redistribution layers (RDLs) electrically connected to the semiconductor die, wherein the one or more fan-out RDLs extend past edges of the semiconductor die onto a top surface of the planarizing polymer layer.

In accordance with yet another embodiment, a method includes forming a first portion of a molding compound around a semiconductor die, forming a polymer layer over the molding compound and the semiconductor die, planarizing the polymer layer to expose the die, and forming a fan-out redistribution layer (RDL) over the polymer layer and the semiconductor die. A top surface of the first portion of the molding compound is lower than a top surface of the semiconductor die. The polymer layer comprises second fillers smaller than first fillers in the molding compound. The fan-out RDL is electrically connected to the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device package comprising:
    a semiconductor die, the semiconductor die comprising:
        a substrate;
        a conductive pillar disposed over the substrate; and
        a dielectric layer disposed around the conductive pillar, the dielectric layer having an upper surface level with the conductive pillar, the dielectric layer having a sidewall coterminous with the substrate of the semiconductor die;
    a molding compound extending along sidewalls of the semiconductor die, wherein the molding compound comprises first fillers, the molding compound contacting the sidewall of the dielectric layer;
    a planarizing polymer layer over the molding compound and contacting the sidewall of the dielectric layer, an interface between the planarizing polymer layer and the molding compound intersecting the dielectric layer, the upper surface of the dielectric layer being free of the planarizing polymer layer, wherein the planarizing polymer layer comprises second fillers smaller than the first fillers, an average thickness of the planarizing polymer layer being no more than about twenty percent of an average thickness of the molding compound; and
    one or more fan-out redistribution layers (RDLs) electrically connected to the semiconductor die, wherein the one or more fan-out RDLs extend past edges of the semiconductor die onto a top surface of the planarizing polymer layer.

2. The device package of claim 1, wherein the first fillers and the second fillers comprise silicon oxide, aluminum oxide, boron nitride, or a combination thereof.

3. The device package of claim 1 further comprising a through-intervia (TIV) extending through the molding compound and the planarizing polymer layer, wherein the TIV is electrically connected to the one or more fan-out RDLs.

4. The device package of claim 1, wherein the first fillers comprise an average diameter of about 25 μm or less, and wherein the second fillers comprise an average diameter of about 5 μm or less.

5. The device package of claim 4, wherein the average diameter of the second fillers no more than about fifty percent of an average diameter of the first fillers.

6. The device package of claim 1, further comprising UBMs formed over the one or more fan-out RDLs.

7. The device package of claim 6, further comprising external connectors disposed on the UBMs.

8. A device package comprises:
    a semiconductor die, the semiconductor die comprising:
        a semiconductor substrate;
        a passivation layer, the passivation layer disposed over the semiconductor substrate; and
        a dielectric layer, the dielectric layer disposed over the passivation layer, the dielectric layer having a bottom surface;
    a molding compound disposed around the semiconductor die, the molding compound having a top surface;
    a planarizing polymer layer over the top surface of the molding compound and around the semiconductor die, a bottom surface of the planarizing polymer layer being above the bottom surface of the dielectric layer and below a top surface of the semiconductor die, the semiconductor die extending through an entirety of the molding compound and the planarizing polymer layer;
    a through-intervia (TIV) extending through the molding compound and the planarizing polymer layer; and
    a fan-out redistribution layer (RDL) over the semiconductor die and the planarizing polymer layer, wherein the fan-out RDL is electrically connected to the semiconductor die and the TIV.

9. The device package of claim 8, wherein the molding compound comprises first fillers, wherein the planarizing polymer layer comprises second fillers and wherein the second fillers are smaller than the first fillers.

10. The device package of claim 9, wherein an average diameter of the second fillers is no more than about fifty percent of an average diameter of the first fillers.

11. The device package of claim 8, wherein the molding compound comprises first fillers, wherein the planarizing polymer layer is substantially free of any fillers.

12. The device package of claim 8, wherein the fan-out RDL contacts a top surface of the planarizing polymer layer.

13. The device package of claim 8, wherein a top surface of the molding compound is lower than a top surface of the semiconductor die and the TIV.

14. The device package of claim 8, wherein top surfaces of the TIV, the planarizing polymer layer, and the semiconductor die are substantially level.

15. A device comprising:
    a semiconductor die comprising:
        a semiconductor substrate;
        a contact pad over the semiconductor substrate;
        a conductive pillar electrically connected to the contact pad; and
        a dielectric layer extending along sidewalls of the conductive pillar;
    a molding compound at least partially encapsulating the semiconductor die, wherein the molding compound comprises first fillers, wherein the molding compound contacts the dielectric layer;
    a polymer layer over the molding compound, wherein an interface between the polymer layer and the molding compound is lower than a top surface of the semiconductor die and higher than a bottom surface of the dielectric layer, the polymer layer having an upper surface level with a top surface of the semiconductor die, and wherein the polymer layer is substantially free of fillers or comprises second fillers smaller than the first fillers, wherein the polymer layer is adjacent to the dielectric layer; and
    a fan-out redistribution structure over the semiconductor die, the molding compound, and the polymer layer.

16. The device of claim 15 further comprising a through-via extending through the molding compound and the polymer layer.

17. The device of claim 16, wherein a conductive line in the fan-out redistribution structure electrically connects the through-via to the conductive pillar.

18. The device of claim 15, wherein the polymer layer comprises second fillers, and wherein a diameter of each of the second fillers is no more than 50% of a diameter of at least one of the first fillers.

19. The device of claim 15, wherein an insulating layer of the fan-out redistribution structure forms an interface with the polymer layer.

20. The device of claim 15, further comprising:
UBMs formed over the fan-out redistribution structure; and
external connectors disposed on the UBMs.

* * * * *